(12) United States Patent
Tajika et al.

(10) Patent No.: US 9,293,074 B2
(45) Date of Patent: Mar. 22, 2016

(54) ACTIVE-MATRIX SUBSTRATE, DISPLAY PANEL, AND DISPLAY PANEL MANUFACTURING METHOD INCLUDING PLURAL TESTING SIGNAL SELECTION CIRCUITS

(75) Inventors: Kenichi Tajika, Osaka (JP); Hiroshi Shirouzu, Shiga (JP)

(73) Assignee: JOLED INC., Tokyo (JP)

( * ) Notice: Subject to any disclaimer, the term of this patent is extended or adjusted under 35 U.S.C. 154(b) by 763 days.

(21) Appl. No.: 13/602,881

(22) Filed: Sep. 4, 2012

(65) Prior Publication Data

US 2012/0326744 A1 Dec. 27, 2012

Related U.S. Application Data

(63) Continuation of application No. PCT/JP2012/000550, filed on Jan. 27, 2012.

(30) Foreign Application Priority Data

Apr. 12, 2011 (JP) ................. 2011-088677

(51) Int. Cl.
| | | |
|---|---|---|
| *G01R 31/02* | (2006.01) | |
| *G01R 31/26* | (2014.01) | |
| *G09G 3/00* | (2006.01) | |
| *H01L 27/32* | (2006.01) | |
| *G09G 3/32* | (2006.01) | |
| *G09G 3/36* | (2006.01) | |

(52) U.S. Cl.
CPC ............... *G09G 3/006* (2013.01); *G01R 31/26* (2013.01); *G09G 3/3225* (2013.01); *G09G 3/3648* (2013.01); *G09G 2330/10* (2013.01); *G09G 2330/12* (2013.01); *H01L 27/3262* (2013.01); *H01L 27/3276* (2013.01)

(58) Field of Classification Search
CPC ............ H01L 27/3244; H01L 27/1255; H01L 27/3276; H01L 29/4908; H01L 27/3262; H01L 29/42384; G01R 31/26; G01R 31/28; G09C 3/30; G09G 3/36
See application file for complete search history.

(56) References Cited

U.S. PATENT DOCUMENTS 6,437,596 B1 * 8/2002 Jenkins et al. ........... 324/754.03
7,038,484 B2 5/2006 Harada et al.

(Continued)

FOREIGN PATENT DOCUMENTS

| JP | 7-260857 | 10/1995 |
|---|---|---|
| JP | 2004-139092 | 5/2004 |

(Continued)

*Primary Examiner* — Vinh Nguyen
(74) *Attorney, Agent, or Firm* — Greenblum & Bernstein, P.L.C.

(57) ABSTRACT

An active-matrix substrate includes: a substrate; gate lines disposed on the substrate; source lines disposed on the substrate in a direction that crosses the gate lines; a first terminal provided for each of data line blocks obtained by grouping every m-lines (m being an integer greater than or equal to 2) of the source lines into a block; a first selection circuit provided for each of the data line blocks, for causing conduction between the first terminal and at least one source line selected from among the m source lines; a second terminal provided for every n-blocks (n being an integer greater than or equal to 2) of the data line blocks; and a second selection terminal provided for every n-blocks of the data line blocks, for causing conduction between the second terminal and at least one source line selected from among the m×n source lines.

15 Claims, 20 Drawing Sheets

(56) References Cited

U.S. PATENT DOCUMENTS

| | | |
|---|---|---|
| 7,663,396 B2 | 2/2010 | Kawata |
| 2003/0189535 A1* | 10/2003 | Matsumoto et al. ............ 345/76 |
| 2006/0028417 A1 | 2/2006 | Harada et al. |
| 2006/0195736 A1* | 8/2006 | Hayashi ........................ 714/724 |
| 2008/0012815 A1* | 1/2008 | Kawata .......................... 345/98 |
| 2012/0056538 A1 | 3/2012 | Shirouzu et al. |

FOREIGN PATENT DOCUMENTS

| | | |
|---|---|---|
| JP | 2006-47197 | 2/2006 |
| JP | 2007-206440 | 8/2007 |
| JP | 2007-304252 | 11/2007 |
| JP | 2009-63954 | 3/2009 |

* cited by examiner

When Tr1 has a gate leak

When Tr2 has a gate leak

When Tr3 has a gate leak

When Tr4 has a gate leak

When Tr1 has an SD short-circuit

When Tr2 has an SD short-circuit

When Tr3 has an SD short-circuit

When Tr4 has an SD short-circuit

ACTIVE-MATRIX SUBSTRATE, DISPLAY PANEL, AND DISPLAY PANEL MANUFACTURING METHOD INCLUDING PLURAL TESTING SIGNAL SELECTION CIRCUITS

CROSS REFERENCE TO RELATED APPLICATION(S)

This is a continuation application of PCT Patent Application No. PCT/JP2012/000550 filed on Jan. 27, 2012, designating the United States of America, which is based on and claims priority of Japanese Patent Application No. 2011-088677 filed on Apr. 12, 2011. The entire disclosures of the above-identified applications, including the specifications, drawings and claims are incorporated herein by reference in their entirety.

TECHNICAL FIELD

One or more exemplary embodiments disclosed herein relate generally to active-matrix substrates used in a display panel, and particularly to a signal line selection circuit provided in an active-matrix substrate.

BACKGROUND ART

Matrix display devices that can freely display text and images are being brought into practical use. These matrix display devices are made up of pixel units which are arranged in a matrix and have separate controls for light emission and light transmittance. Liquid crystal display panels and organic electroluminescence (EL) display panels are examples of matrix display devices.

Most matrix display devices are configured using an active-matrix substrate in which an active circuit for controlling light emission and light transmission is formed in of each of the pixel units. The active-matrix substrate is also referred to as a thin film transistor (TFT) array substrate.

Recently, there has been a remarkable increase in the pixel units provided in a matrix display device (hereafter referred simply as display device), and, with the increase in pixel units, the number of data lines provided for supplying luminance information to the respective pixel units has become enormous. Testing all the data lines is vital to guaranteeing the quality of the display device. However, connecting all the data lines simultaneously to a testing device is not realistic because the same enormous number as that for the data lines is required for the connections (for example, contact points of a prober) between the display device and the testing device.

A technique which defines a block for every predetermined number of data lines, sequentially selects one data line from each of the blocks, and performs testing using the selected data line is commonly known. According to this technique, it is possible to reduce the number of connections between the data lines and the testing device, and, in addition, sequentially perform testing using all of the data lines. An example of a liquid crystal device based on this technique is described in Patent Literature (PTL) 1.

FIG. 15 is a block diagram showing an electrical configuration of a liquid crystal device 900 in PTL 1.

The liquid crystal device 900 is configured of plural pixel units 901 that are arranged in a matrix on a TFT array substrate 908, and pixel units 901 are connected in common in each column of the matrix by a data line 902. One block is defined for every four adjacent data lines 902, and one terminal 903 is provided for each of the blocks.

At the time of testing, a test control circuit (not shown in the figure) supplies a predetermined data signal to the terminals 903 via a probe. A demultiplexer 904 selects one data line 902 at a time from the respective blocks, and the data signal is applied to the selected data line 902.

After the application of the data signal, a shift resistor 905 included in a testing circuit 906 sequentially outputs a shift signal Xi (i=1 to 120) to the corresponding blocks. The testing circuit 906 outputs, to read lines 907, the potentials of the four data lines 902 of the block to which the shift signal Xi was outputted. The test control circuit measures the potentials of the data lines 902 outputted to the read lines 907 to judge whether or not the selected data line 902 of the block to which the shift signal Xi was outputted is normal.

By performing this processing block-sequentially according to the shift signal Xi, and repeating the processing while selecting the other data lines 902 in the block, all the data lines 902 are tested.

CITATION LIST

Patent Literature

[PTL 1] Japanese Unexamined Patent Application Publication No. 2007-304252

SUMMARY OF INVENTION

Technical Problem

However, in the above-described conventional testing technique, there are instances in which sufficient testing accuracy cannot be obtained, and testing and substitution of the demultiplexer itself is not possible.

One non-limiting and exemplary embodiment provides an active-matrix substrate, a method of testing an active-matrix substrate, a matrix display device, and a method of manufacturing a matrix display device which are structured to allow improvement of testing accuracy and allow testing and substitution of the demultiplexer itself.

Solution to Problem

In one general aspect, the techniques disclosed here feature an active-matrix substrate including: a substrate; a plurality of signal lines disposed on the substrate; a first terminal provided for each of signal line blocks obtained by grouping every m-lines of the signal lines into a block, m being an integer greater than or equal to 2; a first selection circuit provided for each of the signal line blocks, for causing conduction between the first terminal and at least one signal line selected from among the m signal lines; a second terminal provided for every n-blocks of the signal line blocks, n being an integer greater than or equal to 2; and a second selection circuit provided for every n-blocks of the signal line blocks, for causing conduction between the second terminal and at least one signal line selected from among m×n signal lines.

According to such a configuration, by introducing the fixed potential to non-selected signal lines which are the signal lines other than the signal line to be tested, from the second terminal via the second selection circuit, the testing signal can be inputted to and outputted from the signal line to be tested, from the first terminal via the first selection circuit, while causing the non-selected signal lines to function as a shield. As a result, the inductive noise superimposed on the testing signal can be reduced, and thus the accuracy of the electrical testing on the active-matrix substrate can be improved.

Furthermore, testing of the first selection circuit and the second selection circuit can be performed by inputting and outputting the testing signal to and from the first terminal and the second terminal.

Furthermore, since configuring one of the first selection circuit and the second selection circuit to be a redundancy circuit of the other allows substitution (repair) during defects, substrate yield can be improved.

These general and specific aspects can be realized not only as such an active-matrix substrate, but also as a display panel using such an active-matrix substrate, an active-matrix subject manufacturing method, and an active-matrix substrate testing method.

Furthermore, these general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects of Invention

As described above, according to the active-matrix substrate according to one or more exemplary embodiments or features disclosed herein, a testing signal can be inputted to and outputted from the signal line to be tested, while causing the non-selected signal lines among to function as a shield, and thus the accuracy of the electrical testing on the active-matrix substrate can be improved.

Furthermore, testing of the first selection circuit and the second selection circuit can be performed by inputting and outputting the testing signal to and from the first terminal and the second terminal.

Furthermore, since configuring one of the first selection circuit and the second selection circuit to be a redundancy circuit of the other allows substitution (repair) during defects, substrate yield can be improved.

BRIEF DESCRIPTION OF DRAWINGS

These and other advantages and features will become apparent from the following description thereof taken in conjunction with the accompanying Drawings, by way of non-limiting examples of embodiments of the present disclosure. In the Drawings.

DESCRIPTION OF EMBODIMENTS

Figure 1:
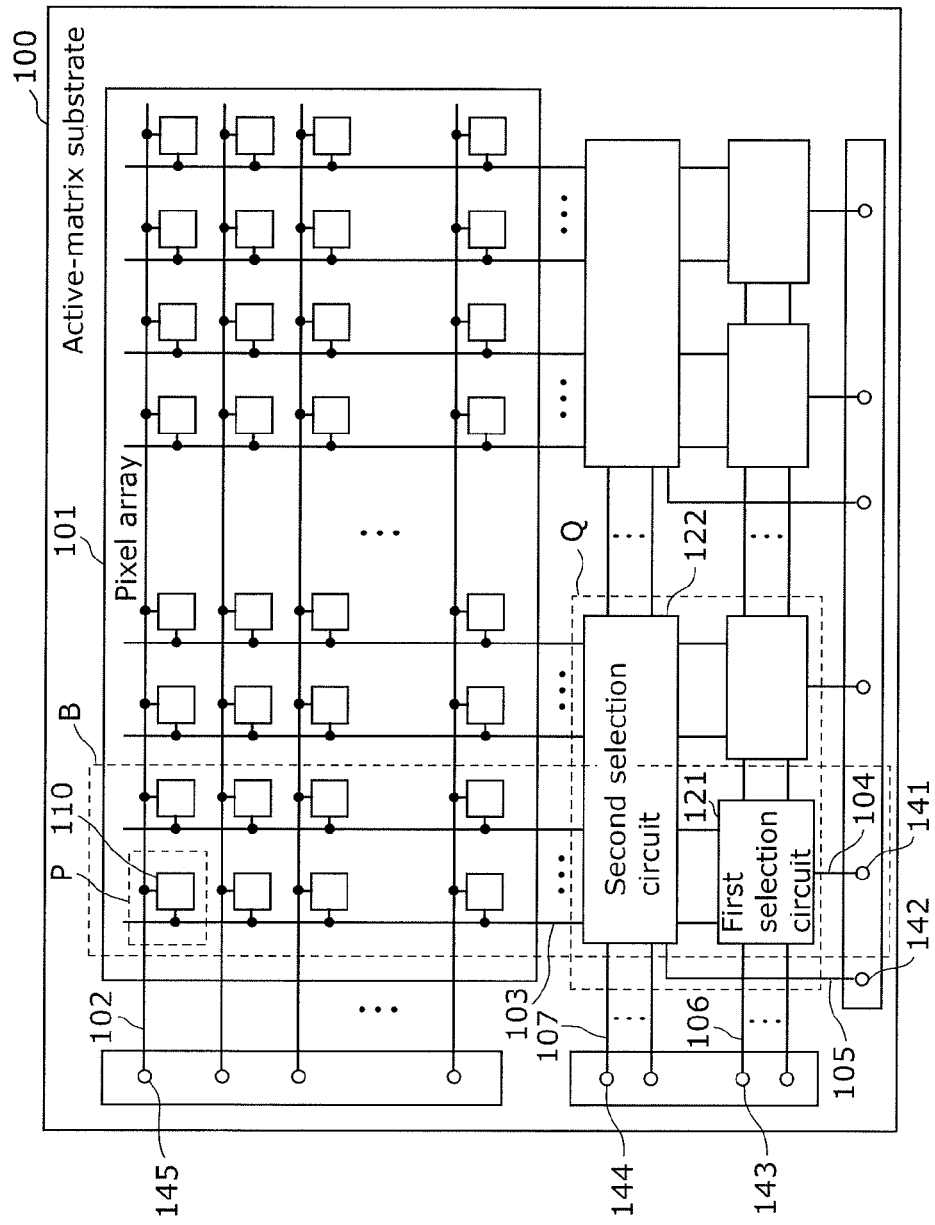
FIG. 1 is a block diagram showing an example of the configuration of an organic EL display panel using an active-matrix substrate in Embodiment 1.

Underlying Knowledge Forming Basis of the Present Disclosure

The problems found by the inventors in relation to the conventional testing techniques described in the Background Art are described in more detail below.

Generally, in testing which is performed by sequentially selecting each of the data lines as described above, there is a first problem in that testing accuracy is lost because the testing signal of the selected data line 902 is affected by extraneous noise.

As an example, testing which is widely-performed in the case where a capacitor for holding luminance information is provided in the pixel unit 901 is one in which the capacitor is charged with a given potential via one data line 902, after which the charge amount of the capacitor is read via the data line 902, and the normality of the capacitor is judged according to the read charge amount.

In such testing, the first problem becomes particularly noticeable because the judgment result is significantly affected by the extraneous noise to the data line 902. However, the conventional technique neither considers such a problem nor suggests a countermeasure.

In addition, the conventional technique has a second problem in that the demultiplexer 904 cannot be tested alone, and a third problem in that there is no means for substitution (repair) when the demultiplexer 904 is defective.

It should be noted that such problems do not occur uniquely in data lines but occur widely in typical signal lines provided in the active-matrix substrate, including scanning lines which are arranged in a direction crossing the data lines.

In order to solve such problems, according to an exemplary embodiment disclosed herein, an active-matrix substrate includes: a substrate; a plurality of signal lines disposed on the substrate; a first terminal provided for each of signal line blocks obtained by grouping every m-lines of the signal lines into a block, m being an integer greater than or equal to 2; a first selection circuit provided for each of the signal line blocks, for causing conduction between the first terminal and at least one signal line selected from among the m signal lines; a second terminal provided for every n-blocks of the signal line blocks, n being an integer greater than or equal to 2; and a second selection circuit provided for every n-blocks of the signal line blocks, for causing conduction between the second terminal and at least one signal line selected from among m×n signal lines.

Here, the first terminal, the first selection circuit, the second terminal, and the second selection circuit may make up a circuit for testing each of the signal lines.

According to such a configuration, the provision of the first selection circuit and the second selection circuit allows the electrical testing on the active-matrix substrate to be performed accurately, and causing one to function as a redundancy circuit of the other allows improvement of active-matrix substrate yield.

Furthermore, in the active-matrix substrate, when the first selection circuit causes conduction between the first terminal and the signal line to be tested, the second selection circuit may be controlled so that conduction is caused between the second terminal and the signal lines other than the signal line to be tested, and a fixed potential is inputted from the second terminal.

According to such a configuration, by introducing the fixed potential to non-selected signal lines which are the signal lines other than the signal line to be tested, it is possible to cause the non-selected signal lines to function as a shield and thus enhance testing accuracy.

Furthermore, at least one of the first selection circuit and the second selection circuit may operate as a multiplexer or a demultiplexer.

Such a configuration is suitable for introducing the fixed potential to the non-selected signal lines which are the signal lines other than the signal line to be tested, to thereby input and output the testing signal to and from the signal line to be tested while causing the non-selected signal lines to function as a shield.

Furthermore, the first selection circuit may include a plurality of first switches each of which switches between conduction and non-conduction between the first terminal and a corresponding one of the signal lines, the second selection circuit may include a plurality of second switches each of which switches between conduction and non-conduction between the second terminal and a corresponding one of the signal lines, and each of the second switches may be capable of functioning as a redundancy circuit of the first switch connected to a same signal line.

According to such a configuration, the second selection circuit is configured to be a redundancy circuit of the first selection circuit and substitution (repair) by the second selection circuit when the first selection circuit is defective is possible, active-matrix substrate yield can be improved. For example, in the case where, in a display panel configured using the active-matrix substrate, the first selection circuit is used as a demultiplexer which distributes, to desired signal lines, a luminance signal applied to the first terminal after testing, there is a significant practical meaning in the first selection circuit being configured to allow substitution by the second signal circuit.

Furthermore, the plurality of signal lines may be one of (i) a plurality of data signal lines and (ii) a plurality of scanning signal lines arranged in a direction that crosses the data signal lines.

Furthermore, the second terminal and the second selection circuit may be provided singly so as to be shared by all of the signal line blocks, and the second selection circuit may cause conduction between the second terminal and at least one data signal line selected from among all of the data signal lines provided on the active-matrix substrate.

Furthermore, the second terminal and the second selection circuit may be provided singly so as to be shared by all of the scanning signal line blocks, and the second selection circuit may cause conduction between the second terminal and at least one scanning signal line selected from among all of the scanning signal lines provided on the active-matrix substrate.

According to such a configuration, the fixed potential can be introduced to the non-selected data signal lines or the non-selected scanning signal by way of the single second terminal and the single second selection terminal that are provided in the active-matrix substrate.

According to an exemplary embodiment disclosed herein, a display panel includes: the active-matrix substrate according to claim 6; and a light-emitting element provided in each of crossings between the scanning signal lines and the data signal lines on the active-matrix substrate.

Furthermore, the light-emitting element may be an organic electroluminescence (EL) element.

According to such a configuration, a display panel having the same advantageous effects as the above-described active-matrix substrate can be obtained.

According to an exemplary embodiment disclosed herein, a method of manufacturing the display panel includes removing, from the active-matrix substrate, a portion including at least one of the first terminal, the first selection circuit, the second terminal, and the second selection circuit.

According to such a manufacturing method, it is possible to physically remove a circuit used for testing including selection circuits and so on, and manufacture a display panel that does not include a circuit used for testing.

A testing method according to an exemplary embodiment disclosed herein is a method of testing the active-matrix substrate, and includes: applying a fixed potential to the second terminal; causing, by the second selection circuit, conduction between the second terminal and the signal lines other than one of the signal lines that is to be tested; causing, by the first selection circuit, conduction between the first terminal and the one of the signal lines that is to be tested, and inputting and outputting a testing signal to and from the first terminal in a state in which the fixed potential is introduced from the second terminal to the signal lines other than the one of the signal lines that is to be tested, via the second selection circuit.

According to such a testing method, by introducing the fixed potential to non-selected signal lines which are the signal lines other than the signal line to be tested, from the second terminal via the second selection circuit, the testing signal can be inputted to and outputted from the signal line to be tested, from the first terminal via the first selection circuit, while causing the non-selected signal lines to function as a shield. As a result, the inductive noise superimposed on the testing signal can be reduced, and thus the accuracy of the electrical testing on the active-matrix substrate can be improved.

A testing method according to an exemplary embodiment disclosed herein is a method of testing the active-matrix substrate, and includes: applying a fixed potential to the second terminal; switching, by the first selection circuit, between conduction and non-conduction between the first terminal and one of the signal lines that is to be tested, and switching, by the second selection circuit, between conduction and non-conduction between the second terminal and the one of the signal lines that is to be tested; and measuring a current that flows to the first terminal according to the application of the fixed potential to the second terminal, for each combination of the conduction or non-conduction between the first terminal and the one of the signal lines that is to be tested and the conduction or non-conduction between the second terminal and the one of the signal lines that is to be tested.

According to such a testing method, depending on the combination of conduction and non-conduction, it is possible to detect whether the first selection circuit or the second selection circuit is defective, in the case where an expected current does not flow to the first terminal and in the case where an unexpected current flows to the first terminal.

A testing method according to an exemplary embodiment disclosed herein, is a method of testing the active-matrix substrate, and includes: causing, by the first selection circuit, conduction between the first terminal and one of the signal lines that is to be tested, causing, by the second selection circuit, conduction between the second terminal and the signal lines other than the one of the signal lines that is to be tested; applying a fixed potential to the second terminal; and causing conduction between the first terminal and the one of the signal lines that is to be tested, and measuring a current that flows to the first terminal according to introduction of the fixed potential from the second terminal to the signal lines other than the one of the signal lines that is to be tested, via the second selection circuit.

According to such a testing method, an unexpected short-circuit between the signal lines can be detected when current flows to the first terminal.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, an active-matrix substrate, an active-matrix substrate testing method, a display panel, and a display panel manufacturing method according to certain exemplary embodiments are described in detail with reference to the accompanying Drawings.

It should be noted that each of the exemplary embodiments described below shows a general or specific example. The numerical values, shapes, materials, structural elements, the arrangement and connection of the structural elements, steps, the processing order of the steps, etc. shown in the following exemplary embodiments are mere examples, and therefore do not limit the scope of the appended claims and their equivalents. Furthermore, among the structural elements in the following exemplary embodiments, structural elements not recited in any one of the independent claims are described as arbitrary structural elements.

Embodiment 1

FIG. 1 is a block diagram showing an example of a functional configuration of an active-matrix substrate 100 in Embodiment 1.

The active-matrix substrate 100 includes a substrate made from glass and so on, for example, and the following which are provided on the substrate: a pixel array 101, gate lines 102, source lines 103, wires 104 to 107, and terminals 141 to 145.

The pixel array 101 is formed by pixel units 100 (i) whose light emission and light transmission are controlled separately and (ii) which are disposed at respective crossings between the gate lines 102 and the source lines 103 which are provided in directions that cross each other. Here, the gate line 102 is an example of a scanning line, and the source line 103 is an example of a data signal line. The source lines 103 are grouped into data signal line blocks, on an m-line per block basis (m is an integer greater than or equal to 2). The section B shown in FIG. 1 corresponds to a single data signal line block.

A terminal 141 and a first selection circuit 121 are provided on a per data signal line block basis, and a terminal 142 and a second selection circuit 122 are provided on an n-data signal line block basis (n is an integer greater than or equal to 2). Here, the terminal 141 is an example of the first terminal, and the terminal 142 is an example of the second terminal.

It should be noted that although the embodiments are described using examples where m=6 and n=2, the values of m and n are not limited by these examples.

The first selection circuit 121 switches between conduction and non-conduction between the terminal 141 and each of the m source lines 103, according to a selection signal inputted to the terminal 143. During the testing of the active-matrix substrate 100, the first selection circuit 121 causes conduction between the terminal 141 and at least one of the source lines 103 that is selected from among the m source lines 103.

The second selection circuit 122 switches between conduction and non-conduction between the terminal 142 and each of m×n source lines 103, according to a selection signal inputted to the terminal 144. During the testing of the active-matrix substrate 100, the second selection circuit 122 causes conduction between the terminal 142 and at least one of the source lines 103 that is selected from among the m×n source lines 103.

Each of the terminals 141 to 145 is provided at a position that allows connection with the prober of the testing device during the testing of the active-matrix substrate 100.

Figure 2:
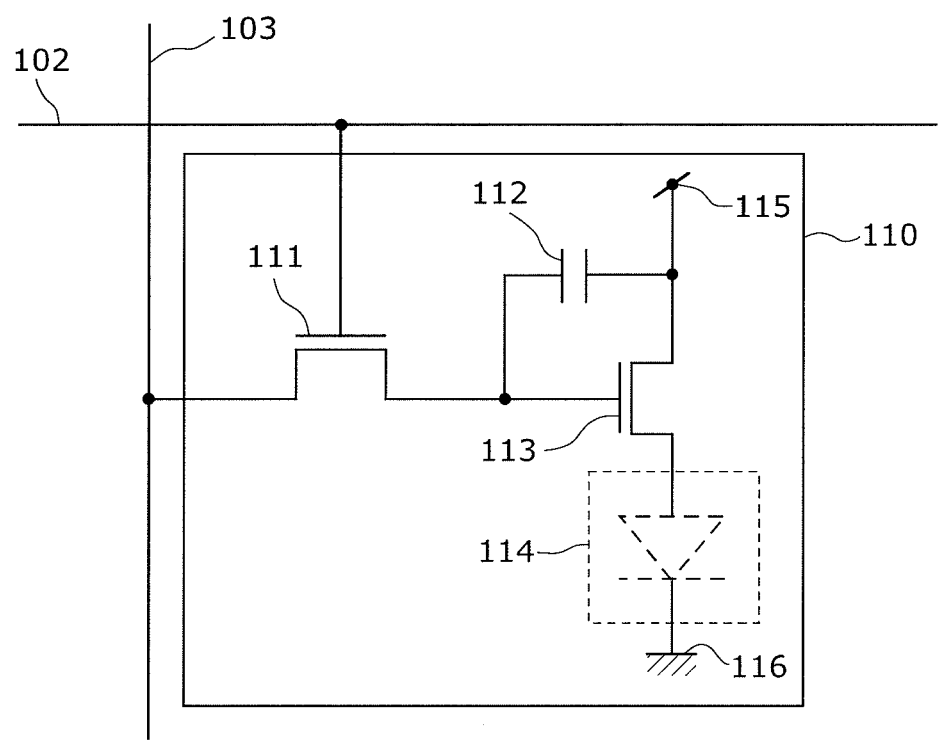
FIG. 2 is a circuit diagram showing an example of a pixel unit provided in the active-matrix substrate in Embodiment 1.

FIG. 2 is a circuit diagram which shows a detailed example of the pixel unit 110, and corresponds to section P shown in FIG. 1.

The pixel unit 110 is provided at the crossing between the gate line 102 and the source line 103 and includes transistors 111 and 113, a capacitor 112, an organic EL element 114, and power supply units 115 and 116. Each of the power supply units 115 and 116 are connected to a power source via wires that are not shown in the figure.

In the pixel unit 110, applying a selection signal to the gate line 102 causes conduction in the transistor 111. The luminance signal supplied to the source wire 103 at this time is held in the capacitor 112. The transistor 113 supplies, to the organic EL element 114, an amount of current that is in accordance with the voltages of both terminals of the capacitor 112. With this, the organic EL element 114 emits light at a luminance that is in accordance with the luminance signal supplied from the source line 103.

It should be noted that, in the case where the transistors 111 and 113 and the capacitor 112 of the pixel unit 110 are defective, in order to prevent the subsequent organic EL element 114 forming process from becoming wasted, the active-matrix substrate 100 is normally tested once at a stage prior to the forming of the organic EL element 114. The exemplary embodiments of the present disclosure can also be effectively applied to an active-matrix substrate that is at such a stage. In other words, the organic EL element 114 is not essential to the present disclosure, and thus an active-matrix substrate on which no organic EL element is formed is included in the present disclosure.

Figure 3:
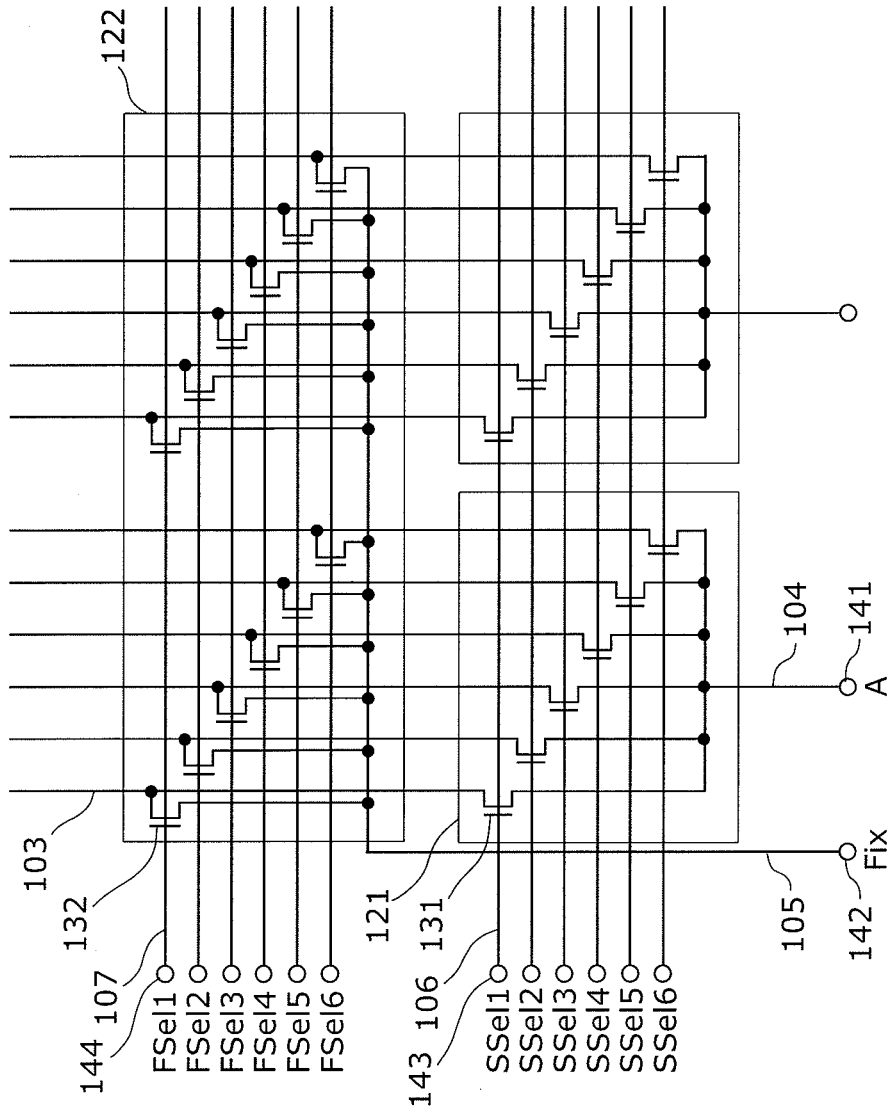
FIG. 3 is a circuit diagram showing an example of a selection circuit provided in the active-matrix substrate in Embodiment 1.

FIG. 3 is a circuit diagram which shows a detailed example of the first selection circuit 121 and the second selection circuit 122, and corresponds to section Q in FIG. 1. FIG. 3 shows an example in which six source lines 103 are grouped into one data signal line block.

The first selection circuit 121 is provided on a data signal line block basis and includes six selection transistors 131 each provided to correspond with a different source line 103 in the data signal line block. Conduction and non-conduction in the selection transistors 131 are switched according to corresponding ones of selection signals SSel1 to SSel6 applied to the terminal 143. Here, the selection transistor 131 is an example of the first switch.

During the testing of the active-matrix substrate 100, the first selection circuit 121 causes conduction between the terminal 141 and at least one of the source lines 103 that is selected from among the 6 source lines 103. A testing signal A is inputted to/outputted from the source line 103 selected by the first selection circuit 121, via the terminal 141.

The second selection circuit 122 is provided for every two data signal line blocks, and includes 12 fixed potential introducing transistors 132 each provided to correspond to a different source line 103 in the two data signal line blocks. Conduction and non-conduction in the fixed potential introducing transistors 132 are switched according to selection signals FSel1 to FSel6 applied to the terminal 144 via the wire 107. Here, the fixed potential introducing transistor 132 is an example of the second switch.

During the testing of the active-matrix substrate 100, the second selection circuit 122 causes conduction between the terminal 142 and at least one of the source lines 103 that is selected from among 12 source lines 103. Fixed potential Fix is introduced to the source line 103 selected by the second selection circuit 122, via the terminal 142

Figure 4:
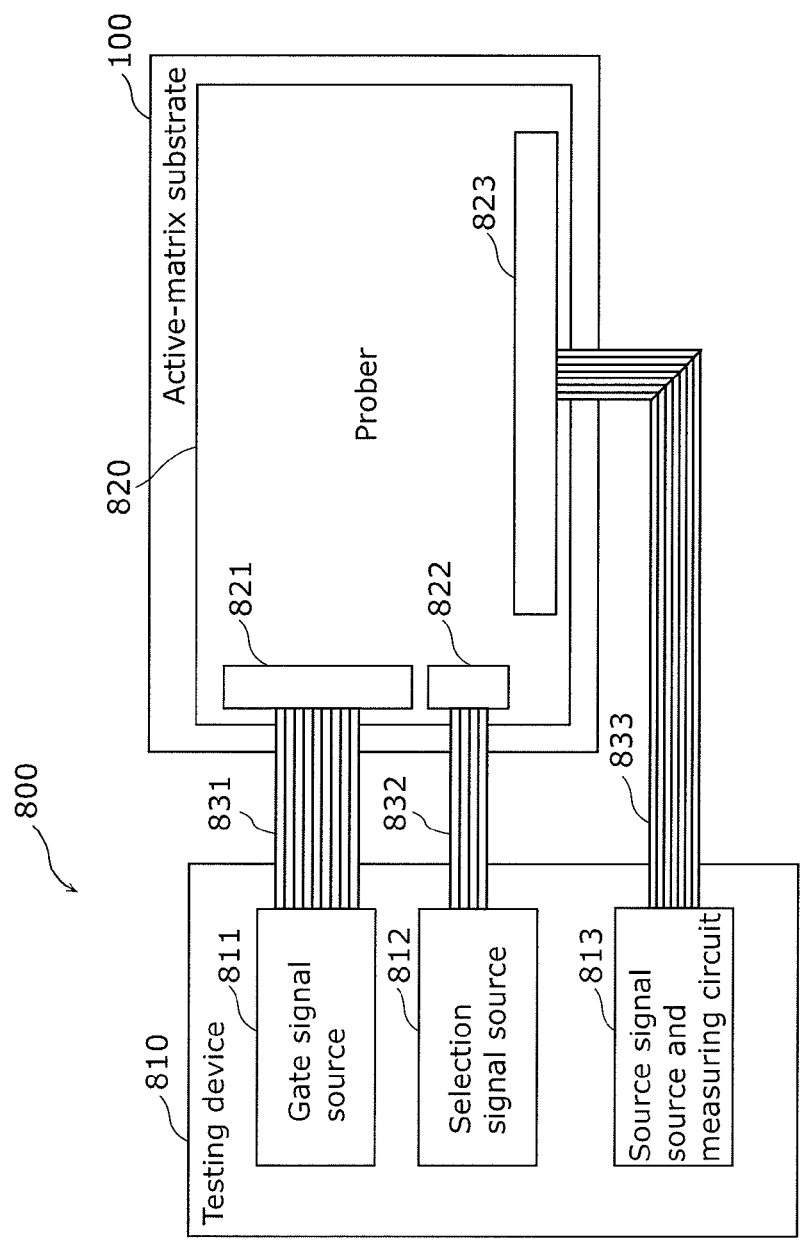
FIG. 4 is a block diagram showing an example of the configuration of a testing system in Embodiment 1.

FIG. 4 is a block diagram showing an example of a specific configuration of a testing system 800.

The testing system 800 is a system for testing the active-matrix substrate and includes: a testing device 810 including a gate signal source 811, a selection signal source 812, a source signal source and measuring circuit 813; a prober 820 including probes 821 to 823; and cables 831 to 833.

The probe 821 is connected to the terminal 145 of the active-matrix substrate 100; the probe 822 is connected to the terminals 143 and 144 of the active-matrix substrate 100; and the probe 823 is connected to the terminal 141 and 142 of the active-matrix substrate 100.

The gate signal source 811 generates a gate signal. The generated gate signal is applied to the gate line 102 connected to the pixel unit 110 to be tested, via the cable 831, the probe 821, and the terminal 145.

The selection signal source 812 generates the selection signals SSel1 to SSel6 and FSel1 to FSel6. The generated selection signals SSel1 to SSel6 are applied to the first selection circuit 121 via the cable 832, the probe 822, and the terminal 143; and the generated selection signals FSel1 to FSel6 are applied to the second selection circuit 122 via the cable 832, the probe 822, and the terminal 144.

The source signal source and measuring circuit 813 generates the testing signal A and the fixed potential Fix. A generated testing signal input signal $A_{in}$ is applied to the first selection circuit 121 via the cable 833, the probe 823, and the terminal 144; and the generated fixed potential Fix is applied to the second selection circuit 122 via the cable 833, the probe 823, and the terminal 142. The source signal source and measuring circuit 813, in addition, obtains a testing output signal $A_{out}$ from the terminal 141, via the probe 823 and the cable 833.

As a typical example of the testing implemented through the testing system 800 configured in the above-described manner, there is a test for checking whether or not the capacitor 112 provided in each of the pixel units 110 of the active-matrix substrate 100 is formed having the designed capacitance value (hereafter referred to as capacitor test).

Figure 5A:
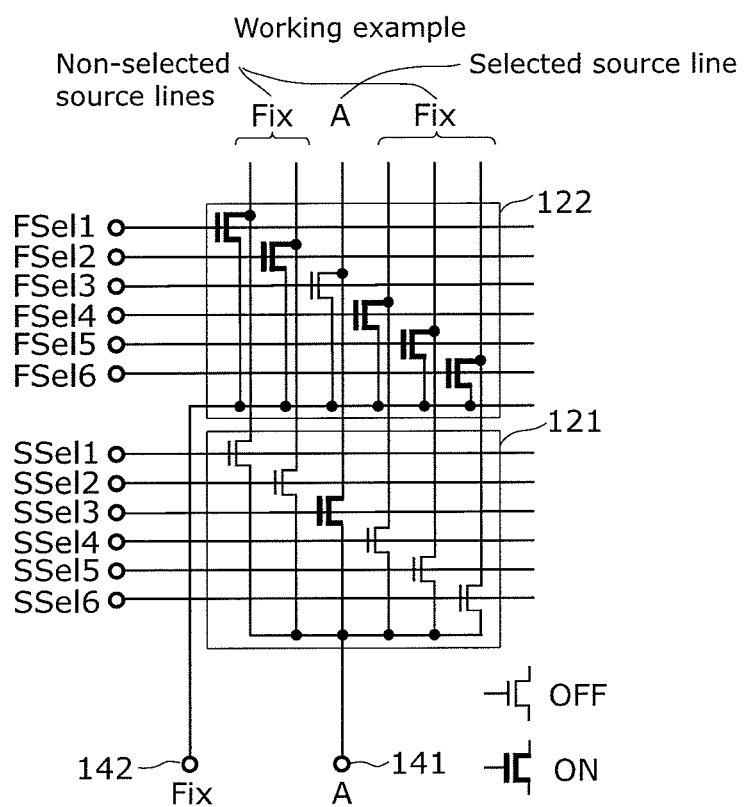
FIG. 5A is a diagram for describing a working example of a capacitor test according to the present disclosure.

FIG. 5A is a diagram for describing a working example of a capacitor test, and shows, with regard to one data signal line block, the state of the first selection circuit 121 and the second selection circuit 122 during the implementation of the capacitor test.

Here, it is assumed that the third source line from the left in the figure is the selected source line to be tested, and the rest of the source lines are non-selected source lines. Furthermore, a transistor shown in bold is in state of conduction (ON) and a transistor shown in normal thickness is in a state of non-conduction (OFF).

The capacitor test is implemented, for example, according to the following procedure.

The fixed potential Fix is applied from the source signal source and measuring circuit 813 to the terminal 142.

A gate signal is applied from the gate signal source 811 to one of the gate lines 102.

By applying the predetermined selection signals FSel1 to FSel6 from the selection signal source 812 to the second selection circuit 122, the second selection circuit 122 causes conduction between the non-selected source lines and the terminal 142.

By applying the predetermined selection signals SSel1 to SSel6 from the selection signal source 812 to the first selection circuit 121, the first selection circuit 121 causes conduction between the selected source line and the terminal 141.

The capacitor to be tested is charged by applying the testing input signal $A_{in}$ from the source signal source and measuring circuit 813 to the terminal 141 while introducing the fixed potential Fix from the terminal 142 to the non-selected source lines via the second selection circuit 122. Stated differently, an electric charge is written into the capacitor to be tested.

Then, while introducing the fixed potential Fix to source lines other than the source line to be tested, from the terminal 142 via the second selection circuit 122, the application of the testing input signal $A_{in}$ is stopped, and the testing output signal $A_{out}$ which reflects the electric charge amount held in the capacitor is obtained from the terminal 141 by the source signal source and measuring circuit 813. In addition, the electric charge amount is measured from the obtained testing output signal $A_{out}$, and the measured value of the capacitance of the capacitor 112 is obtained from the measured electric charge amount.

In the capacitor test implemented in such manner, the application of the testing input signal $A_{in}$ to the selected source line and the measurement of the electric charge amount through the obtainment of the testing output signal $A_{out}$ after the stopping of the application of the testing input signal $A_{in}$ are performed while the fixed potential Fix is introduced to the non-selected source lines, and thus it is possible to cause the non-selected lines to act as a shield to reduce inductive noise and thus enhance testing accuracy.

Figure 5B:
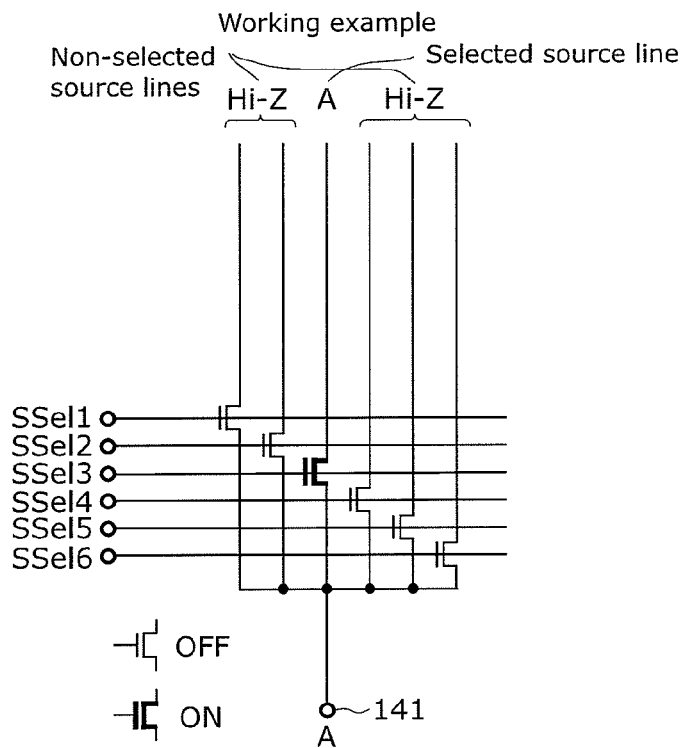
FIG. 5B is a diagram for describing a comparative example of a capacitor test according to the conventional technique.

FIG. 5B is a diagram for an example of a capacitor test in a comparative example, and shows a capacitor test in the case where there is no second selection circuit 122.

In the capacitor test in the comparative example, the testing input signal $A_{in}$ is applied to the selected source line in a state where the non-selected source lines are left in a high-impedance state, and the electric charge amount measurement through the obtainment of the testing output signal $A_{out}$ from the selected source line is performed subsequently, and thus it is not possible to cause the non-selected lines to act as a shield, and deterioration of testing accuracy due to inductive noise occurs easily.

Figure 5C:
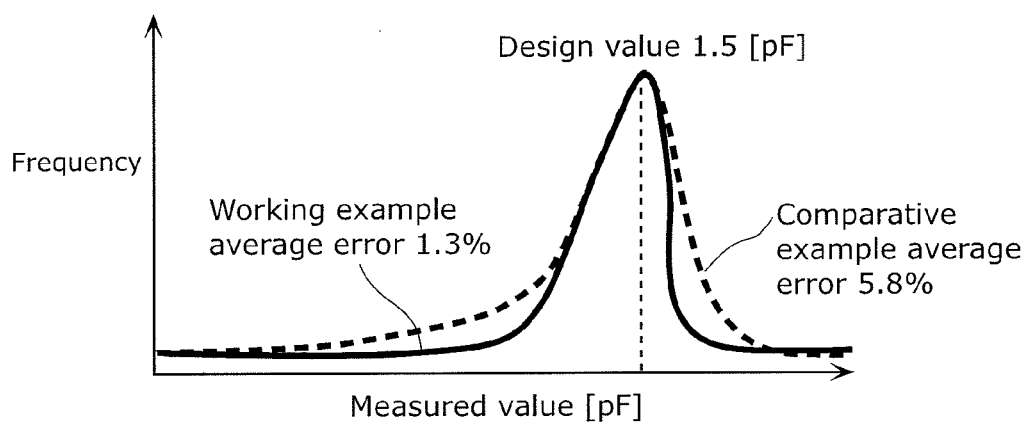
FIG. 5C is a graph for describing an example of results according to a capacitor test according to the present disclosure.

FIG. 5C is a graph for describing an example of results according to one working example of a capacitor test according to the present disclosure, and shows the frequency distribution of the measured values of capacitances for the present disclosure and a comparative example. The frequency distributions are those obtained by actually measuring an active-matrix substrate in which the capacitance design value of the capacitor is 1.5 pF.

It is clear from the form of the graphs that the variation in the measured values according to the present disclosure is smaller than the variation in the measured values according to the comparative example. The average error of the measured values with respect to the design value is 5.8% for the comparative example and 1.3% for the present disclosure. Based on this, it can be seen that the capacitor test of the active-matrix substrate 100 can obtain a higher testing accuracy than that in the comparative example.

Next, a modification of the capacitor test of the active-matrix substrate 100, which is capable of improving testing efficiency, shall be described.

Figure 6:
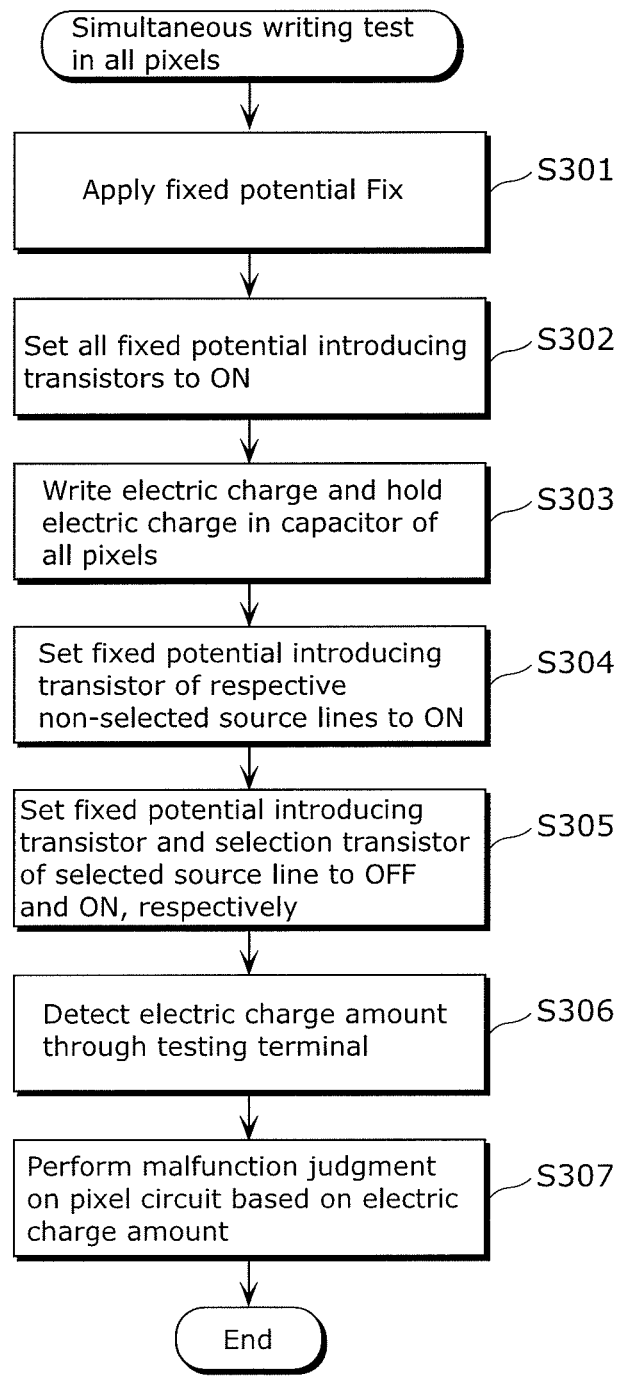
FIG. 6 is flowchart showing an example of an all-pixel simultaneous writing test in Embodiment 1.

FIG. 6 is a flowchart showing a modification of the capacitor test.

In the capacitor test shown in FIG. 6, the fixed potential Fix is applied to the terminal 142 (S301), all the fixed potential introducing transistors 132 are set to ON (S302), and electric charge writing/electric charge holding is performed on the capacitors of all of the pixel units 110 (S303).

Subsequently, the fixed potential introducing transistor 132 of the respective non-selected source lines, that is the respective source lines 103 that are not to be tested, is set to ON (S304), the fixed potential introducing transistor 132 and the selection transistor 131 of the selected source line, that is, the source line 103 to be tested are set to OFF and ON, respectively (S305), the electric charge amount held in the capacitor is detected through the terminal 141 which is a testing terminal (S306), and the malfunction judgment for the pixel unit 110 is performed based on the detected electrical charge amount (S307).

In such a modification of the capacitor test, writing is preformed simultaneously in all the pixels, and thus testing efficiency is improved compared to when writing is performed sequentially on the respective pixels.

In the active-matrix substrate 100, aside from the capacitor test, it is also possible to test the functions of the first selection circuit 121 and the second selection circuit 122, or test that source lines 103 are not shorted out.

Figure 7:
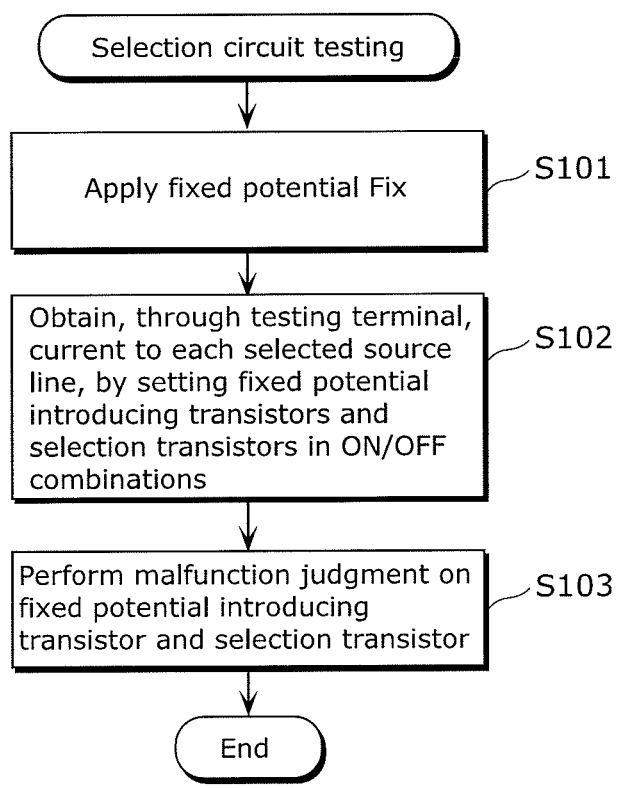
FIG. 7 is flowchart showing an example of a single selection circuit test in Embodiment 1.

FIG. 7 is a flowchart showing an example of a selection circuit test for testing the functions of the first selection circuit 121 and the second selection circuit 122.

In the selection circuit test shown in FIG. 7, the fixed potential Fix is applied to the terminal 142 (S101), the current flowing to each selected source line, that is, the source line 103 to be tested, is obtained through the terminal 141 which is a testing terminal, by setting the fixed potential introducing transistors 132 and the selection transistors 131 in ON/OFF combinations (S102), and malfunction judgment for each of the fixed potential introducing transistors 132 and each of the selection transistors 131 is performed (S103).

Figure 8:
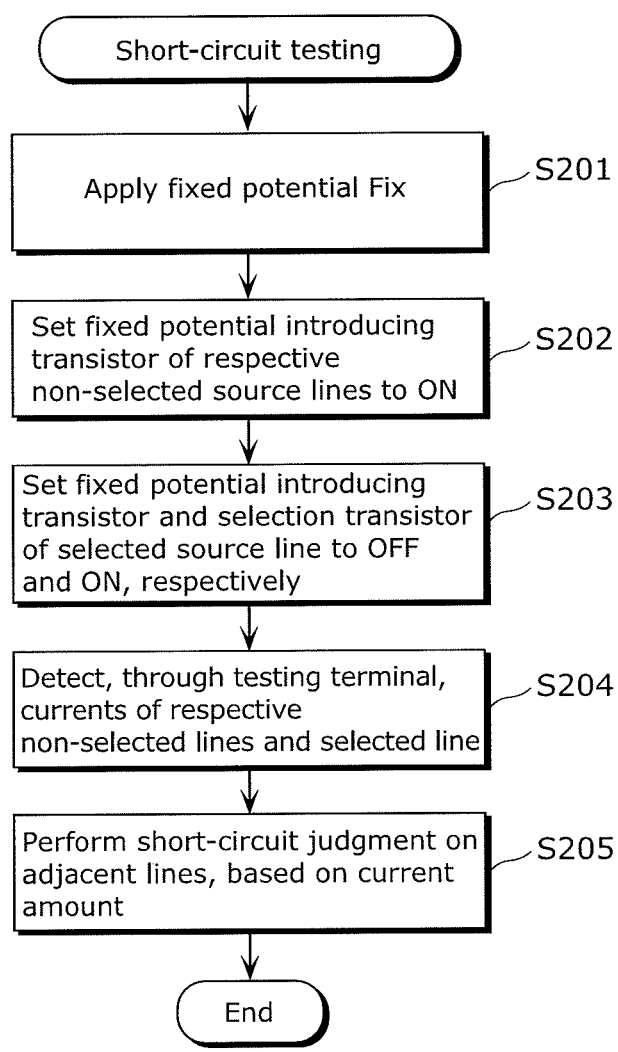
FIG. 8 is flowchart showing an example of a short-circuit test between data lines in Embodiment 1.

FIG. 8 is a flowchart showing an example of a short-circuit test for checking that source lines 103 inside a data signal line block are not shorted out.

In the short-circuit test shown in FIG. 8, the fixed potential Fix is applied to the terminal 142 (S201), the fixed potential introducing transistor 132 of the respective non-selected source lines, that is the respective source lines 103 that are not to be tested, is set to ON (S202), the fixed potential introducing transistor 132 and the selection transistor 131 of the selected source line, that is, the source line 103 to be tested are set to OFF and ON, respectively (S203). Then, the current flowing to each of the respective non-selected source lines and the selected source line is detected through the terminal 141 which is a testing terminal (S204), and the short-circuit judgment for adjacent wires is performed based on the current amounts (S205).

As described above, in the active-matrix substrate 100, a testing signal can be inputted to and outputted from the selected source line while the non-selected source lines among the source lines 103 inside a data signal line block function as a shield, and thus the accuracy of the electrical testing on the active-matrix substrate 100 can be improved.

Furthermore, by inputting and outputting testing signals from the terminals 141 and 142, testing of the first selection circuit 121 and the second selection circuit 122 can be performed.

It should be noted that although a configuration example in which source lines are grouped into data signal line blocks, and the advantageous effects thereof have been described thus far, the same configuration may also be applied to the gate lines 102. Specifically, it is also acceptable to group the gate lines 102 into scanning signal line blocks on an m-line per block basis (m is an integer greater than or equal to 2), providing the terminal 141 and the first selection circuit 121 on a per scanning signal line block basis, and provide the terminal 142 and the second selection circuit 122 on an n-data signal line block basis (n is an integer greater than or equal to 2). It is clear that even in such a configuration, the same advantageous effects as the advantageous effects described above can be obtain.

Embodiment 2

In Embodiment 2, a layout of a selection circuit in which one of the first selection circuit 121 and the second selection circuit 122 can function as a redundancy circuit of the other shall be described. It should be noted that the selection circuit referred to here is a collective designation for the first selection circuit 121 and the second selection circuit 122.

As an example, in the case where the first selection circuit 121 is found be defective when the first selection circuit 121 is used as a demultiplexer which distributes, to a desired signal line, a luminance signal A that is applied to the terminal 141 after testing, the above layout allows substitution of the first selection circuit 121 with the second selection circuit 122.

Figure 9:
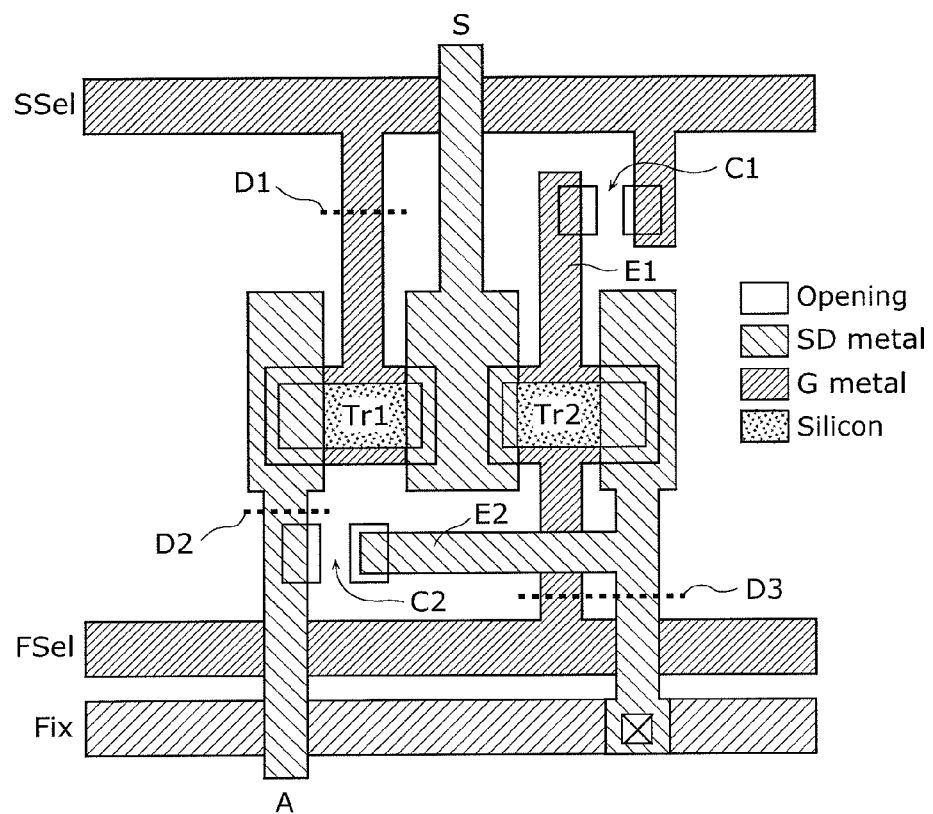
FIG. 9 is a layout diagram showing an example of a selection circuit in Embodiment 2.

FIG. 9 is a layout diagram showing an example of a selection circuit in Embodiment 2. The layout shown in FIG. 9 shows a part corresponding to one source line of the selection circuit. The selection circuit is configured to include as many of such parts as the number of source lines. It should be noted that, as long as there is no need for distinction, such part of the selection circuit is also simply referred to as the selection circuit.

In FIG. 9, Tr1 functions as the selection transistor 131, and Tr2 functions as the fixed potential introducing transistor 132. Furthermore, S denotes a connection to the source line 103, A denotes a connection to the terminal 141, Fix denotes a connection to the terminal 142, SSel denotes a connection to the terminal 143, and FSel denotes a connection to the terminal 144.

This selection circuit is configured by stacking a G (gate) metal, silicon, and an SD (source/drain) metal, in this order, in the pattern shown in FIG. 9, and, in addition, by being covered by an insulating layer not shown in the figure.

This layout is configured to allow repair in which TR1 is substituted by TR2 when TR1 is defective (that is, the second selection circuit 122 can function as a redundancy circuit of the first selection circuit 121).

As such, extensions E1 and E2 are provided in the G metal and SD metal, respectively. In the insulating layer, openings exposing the G metal and the SD metal are provided in respective tip areas of the extensions E1 and E2 of the G metal and SD metal and in a part of the G metal and the SD metal facing the respective tip areas.

The gap between the opposing openings is defined as repair connecting sections C1 and C2. By placing a conductive repair material in each of the repair connecting sections C1 and C2 at the time of repair, the pair of G metals and the pair of SD metals that are exposed become electrically connected. The repair material is placed using, for example, conductive tape or laser CVD, and so on.

In addition, repair disconnecting sections D1 to D3 are defined, and the G metal and the SD metal are disconnected at the repair disconnecting sections D1 to D3 at the time of repair. The G metal and the SD metal are disconnected, for example, by laser irradiation, and so on.

According to such a layout, extension of the repair material is shortened through the provision of the extensions E1 and E2, and the connections between the repair material and the G metal and SD metal are simplified and made reliably through the provision of the openings before hand, and thus the time it takes for connecting repair is shortened and reliability is improved. Furthermore, since the repair disconnecting section D3 is defined at a section in which the G metal and the SD metal run parallel, both the G metal and the SD metal can be disconnected in one laser processing, and thus the time it takes for disconnecting repair is shortened.

Figure 10:
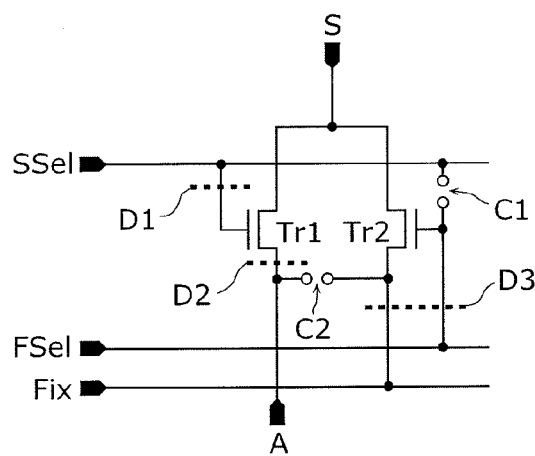
FIG. 10 is an equivalent circuit diagram corresponding to the example of a selection circuit in Embodiment 2.

FIG. 10 is an equivalent circuit diagram of the selection circuit which clearly indicates the correspondences with the layout shown in FIG. 9.

According to the selection circuit shown in FIG. 9 and FIG. 10, when TR 1 is defective, it is possible to substitute TR1 with TR2, and thus improve substrate yield, by performing repair which connects the repair connecting sections C1 and C2 and disconnects the repair disconnecting sections D1 to D3.

It should be noted that, depending on the defect of Tr1, there are cases where all of the repair disconnecting sections D1 to D3 need to be disconnected and cases where partial disconnection is sufficient. Some examples are given below.

Figure 11A:
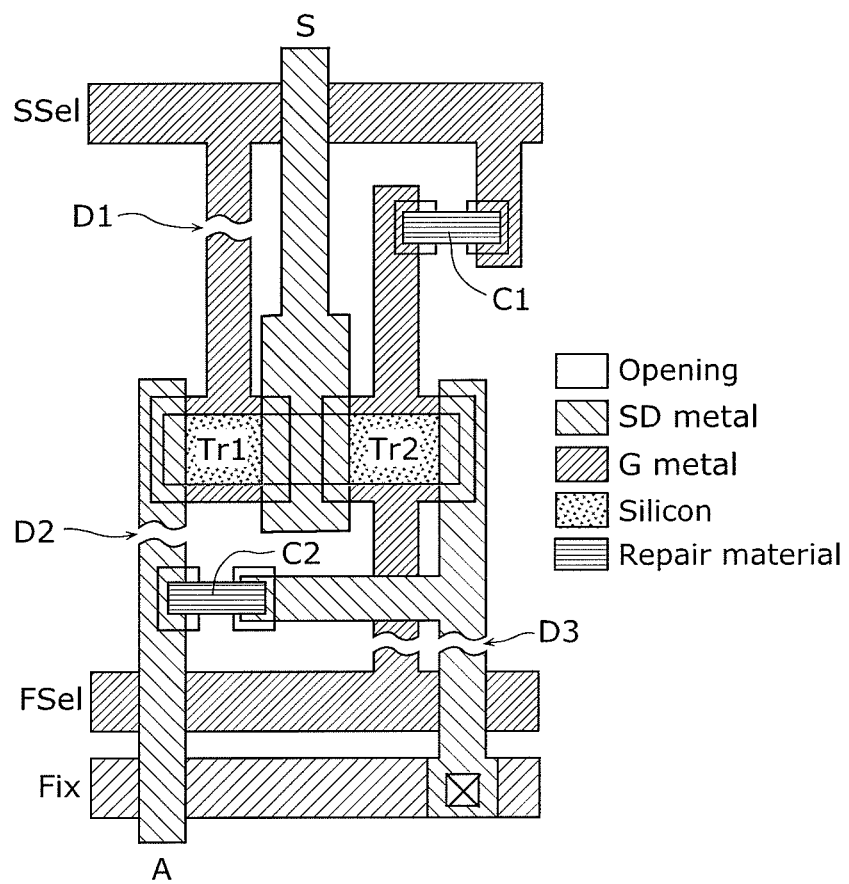
FIG. 11A is a layout diagram showing an example of repair processing for the selection circuits in Embodiment 2.

FIG. 11A shows a repair processing that is performed when the defect of Tr1 is a gate leak. In this case, it is necessary to disconnect all of the repair disconnecting sections D1 to D3 and connect the repair connecting sections C1 and C2.

Figure 11B:
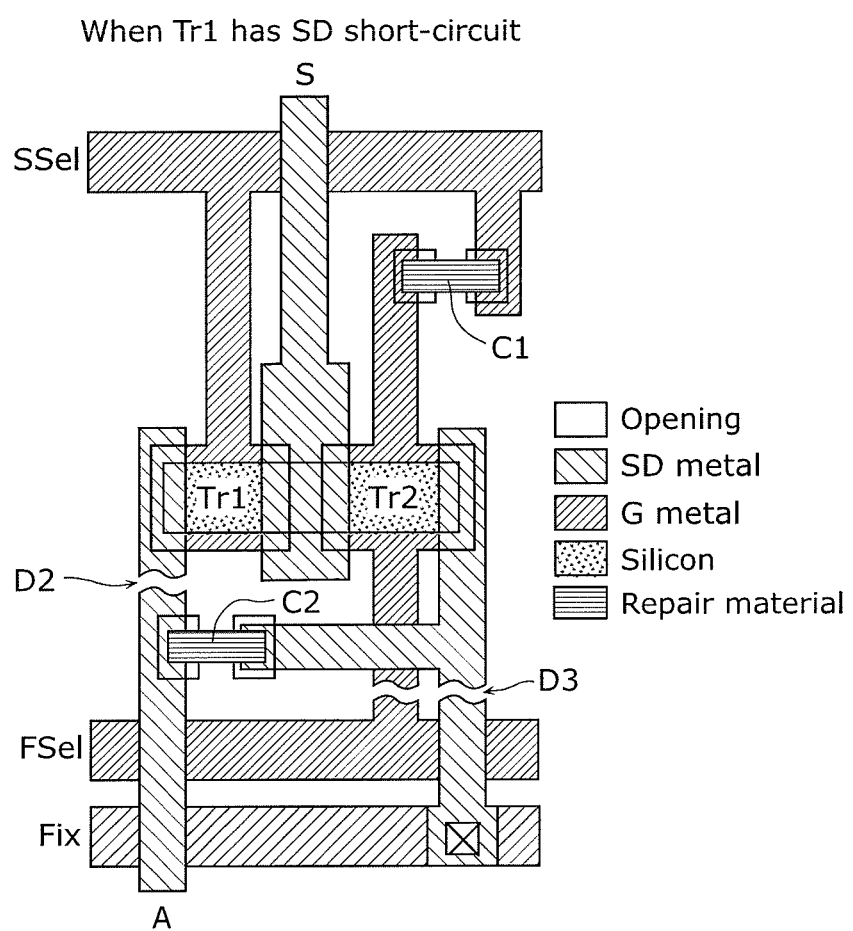
FIG. 11B is a layout diagram showing an example of repair processing for the selection circuits in Embodiment 2.

FIG. 11B shows a repair processing that is performed when the defect of Tr1 is an SD short-circuit. In this case, although it is necessary to disconnect the repair disconnecting sections D2 and D3 and connect the repair connecting sections C1 and C2, it is not necessary to disconnect the repair disconnecting section D1.

Figure 11C:
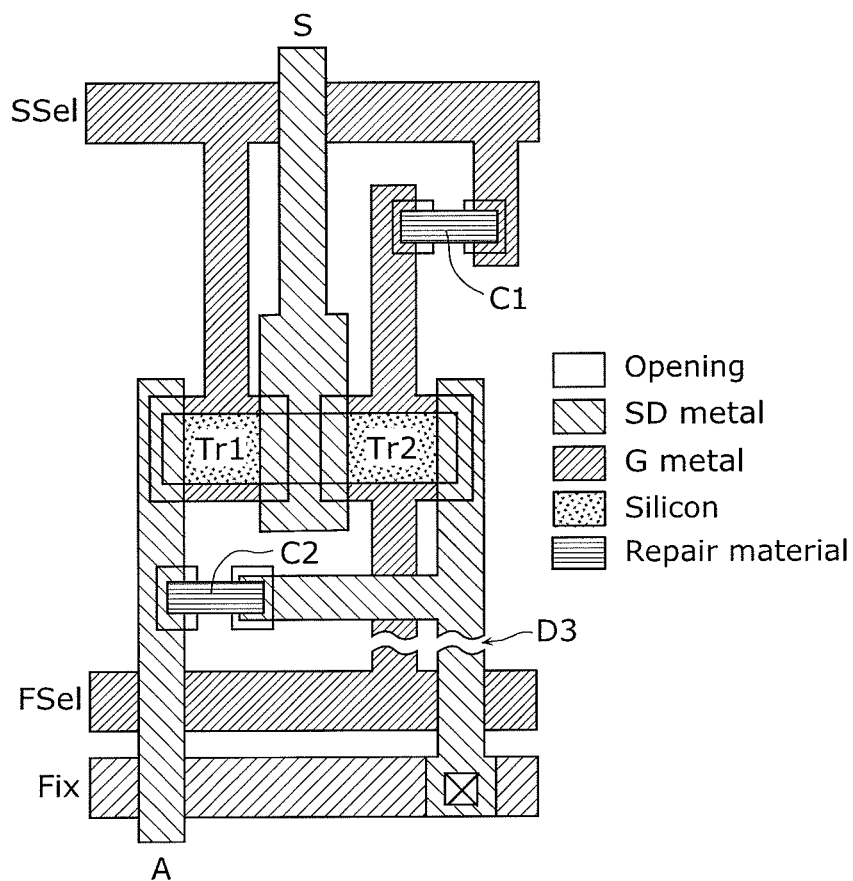
FIG. 11C is a layout diagram showing an example of repair processing for the selection circuits in Embodiment 2.

FIG. 11C shows a repair processing that is performed when the defect of Tr1 is an SD open-circuit. In this case, although it is necessary to disconnect the repair disconnecting section D3 and connect the repair connecting sections C1 and C2, it is not necessary to disconnect the repair disconnecting sections D1 and D2.

By performing the necessary and minimum repair according to the defect of Tr1 in the above manner, repair cost can be optimized.

The selection circuit configured such that the second selection circuit 122 functions as a redundancy circuit of the first selection circuit 121 has been described up to this point.

Next, another layout of a selection circuit configured so that the first selection circuit 121 and the second selection circuit 122 can reciprocally function as redundancy circuits shall be described.

Figure 12:
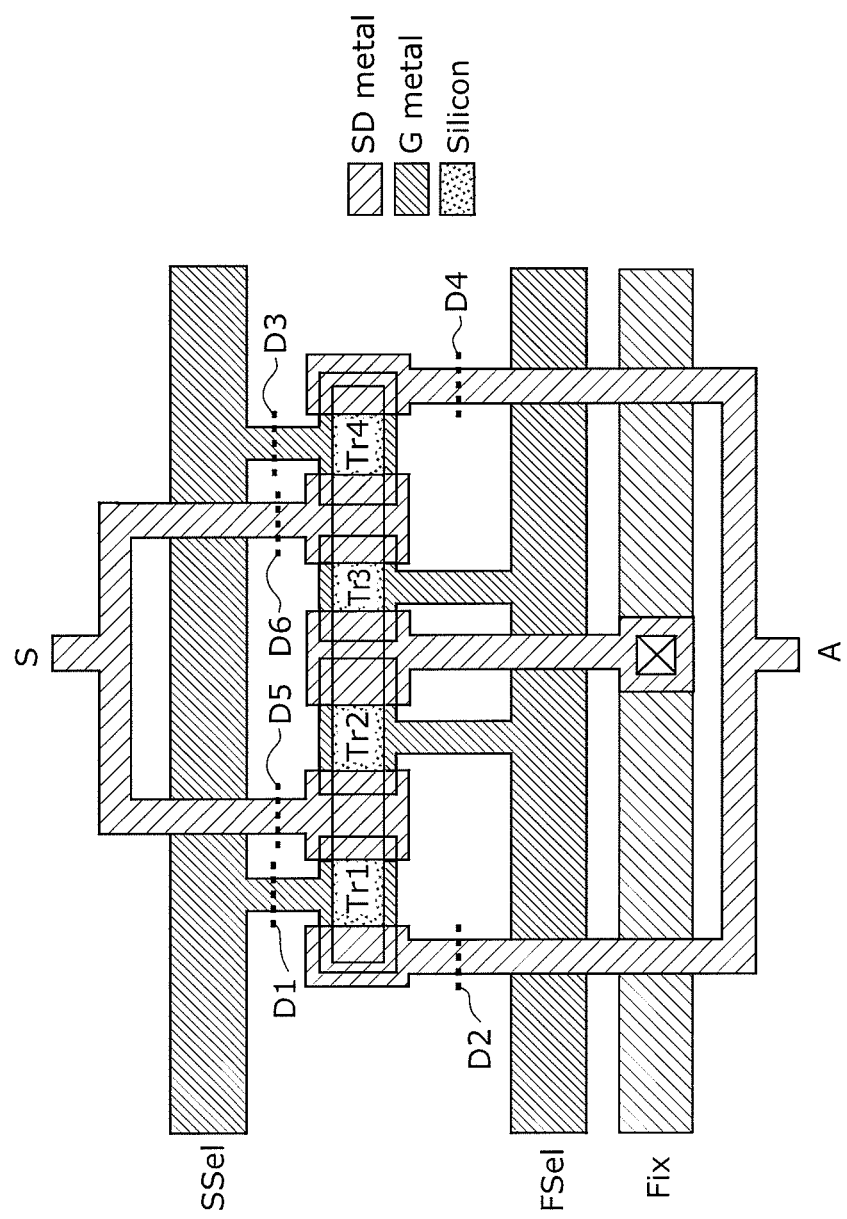
FIG. 12 is a layout diagram showing an example of a selection circuit in Embodiment 2.

FIG. 12 is a layout diagram showing another example of a selection circuit in Embodiment 2. The layout shown in FIG. 12 shows a part corresponding to one source line of the selection circuit. The selection circuit is configured to include as many of such parts as the number of source lines. It should be noted that, as long as there is no need for distinction, such part of the selection circuit is also simply referred to as the selection circuit.

In FIG. 12, each of Tr1 and Tr4 function as the selection transistor 131, and each of Tr2 and Tr3 function as the fixed potential introducing transistor 132. Furthermore, S denotes a connection to the source line 103, A denotes a connection to the terminal 141, Fix denotes a connection to the terminal 142, SSel denotes a connection to the terminal 143, and FSel denotes a connection to the terminal 144.

This selection circuit is configured by stacking a G (gate) metal, silicon, and an SD (source/drain) metal, in this order, in the pattern shown in FIG. 12, and, in addition, by being covered by an insulating layer not shown in the figure.

The layout is configured to allow repair for substituting one of Tr1 and Tr4 with the other when defective, and substituting one of Tr2 and Tr3 with the other when defective (that is, each of the first selection circuit 122 and the second selection circuit 122 can function as its own redundancy circuit).

As such, repair disconnecting sections D1 to D6 are defined, and the G metal and the SD metal are disconnected at least one of the repair disconnecting sections D1 to D6 at the time of repair. The G metal and the SD metal are disconnected, for example, by laser irradiation, and so on.

Figure 13:
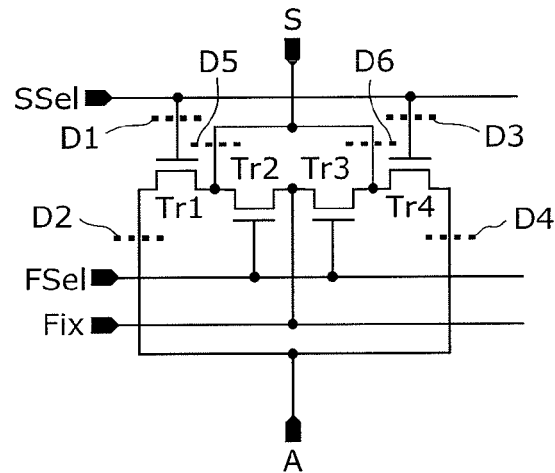
FIG. 13 is an equivalent circuit diagram corresponding to the example of a selection circuit in Embodiment 2.

FIG. 13 is an equivalent circuit diagram of the selection circuit which clearly indicates the correspondences with the layout shown in FIG. 12.

Some examples regarding which of the repair disconnecting sections D1 to D6 are to be disconnected depending on the defect of Tr1 to Tr4 are given below.

Figure 14A:
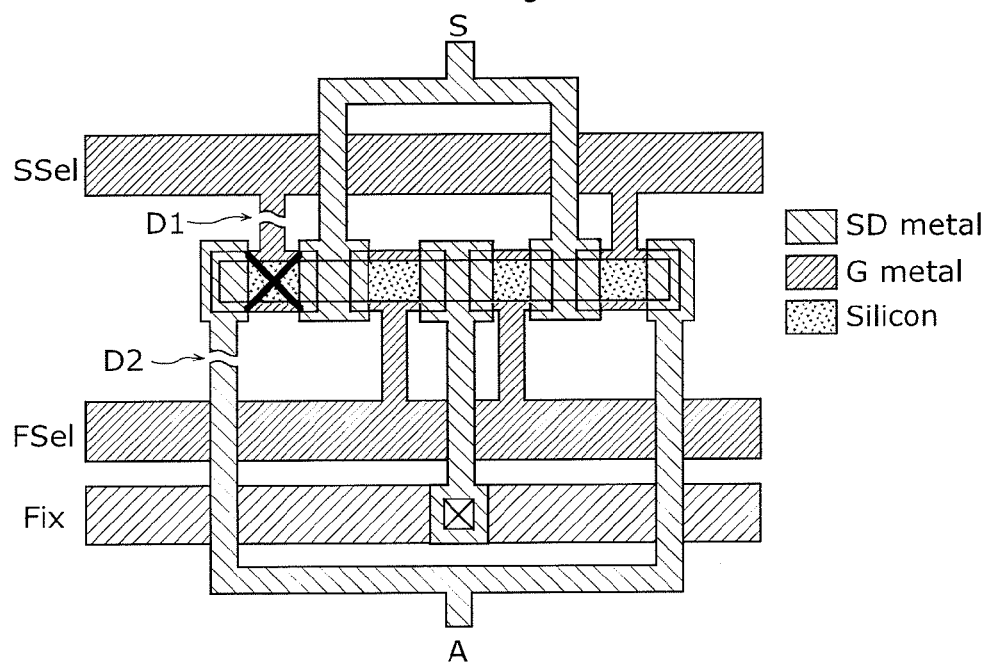
FIG. 14A is a layout diagram showing an example of repair processing for the selection circuits in Embodiment 2.
Figure 14B:
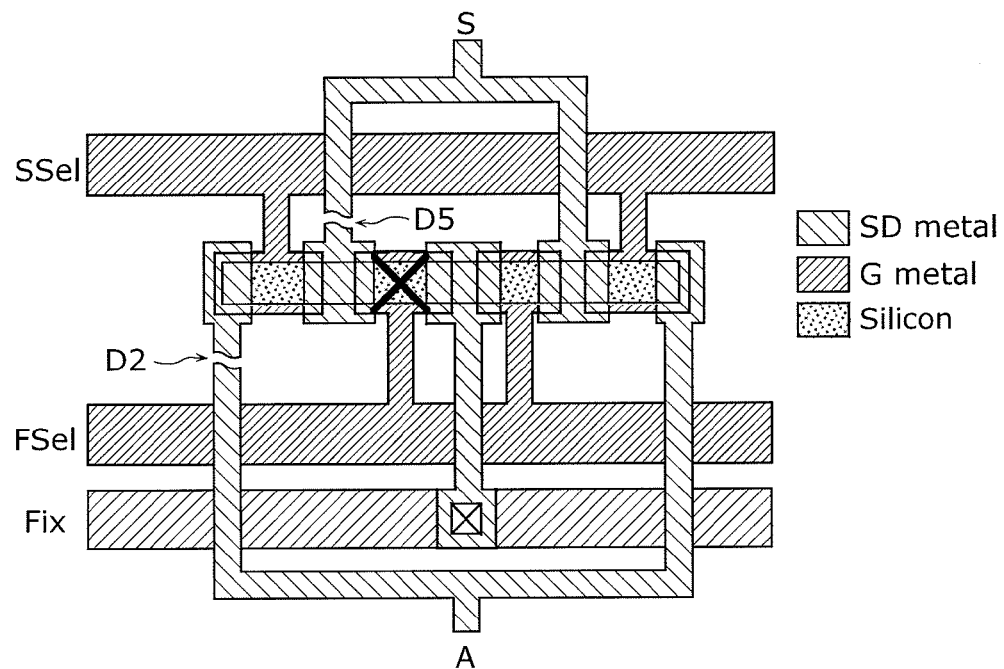
FIG. 14B is a layout diagram showing an example of repair processing for the selection circuits in Embodiment 2.
Figure 14C:
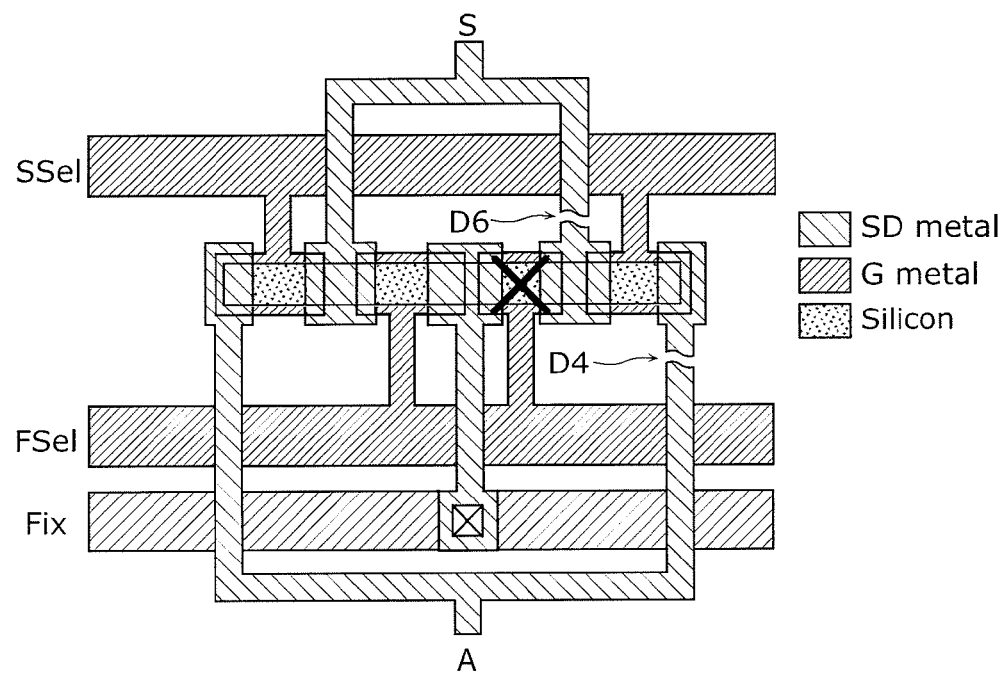
FIG. 14C is a layout diagram showing an example of repair processing for the selection circuits in Embodiment 2.
Figure 14D:
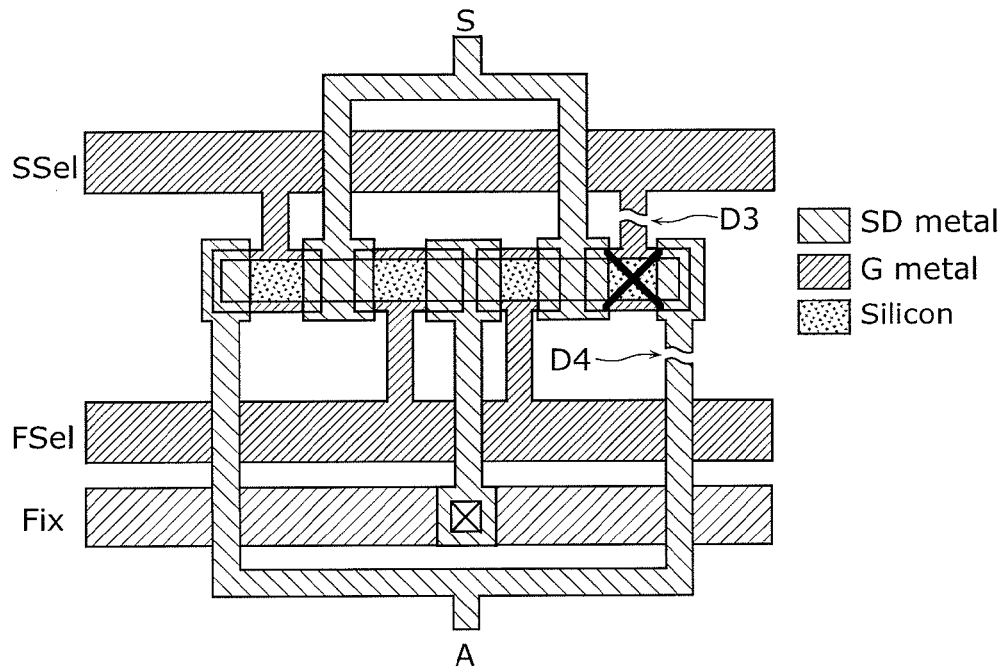
FIG. 14D is a layout diagram showing an example of repair processing for the selection circuits in Embodiment 2.
Figure 14E:
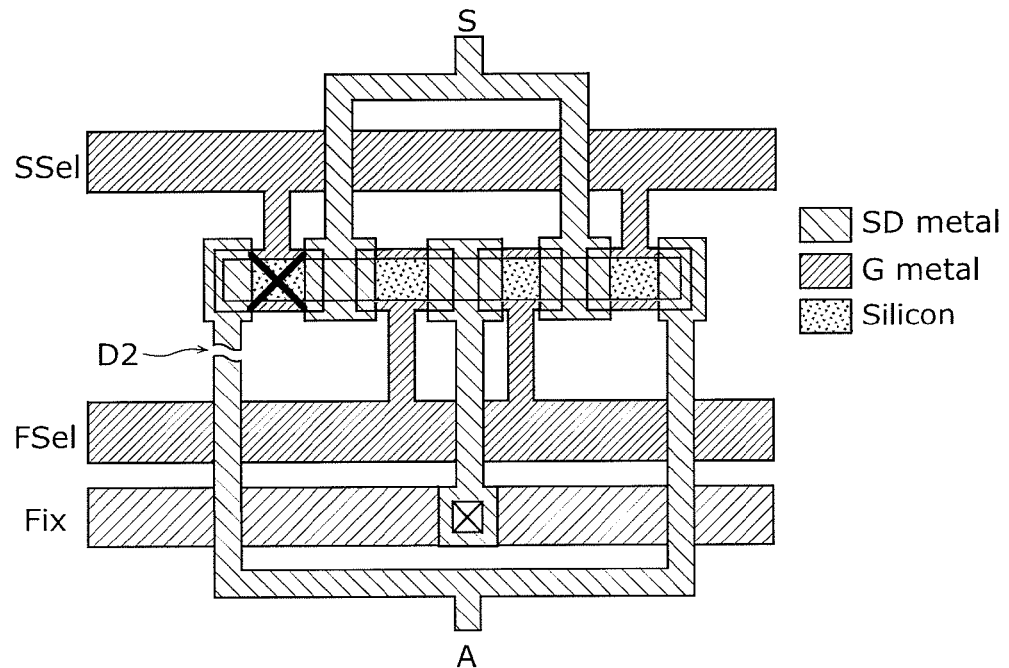
FIG. 14E is a layout diagram showing an example of repair processing for the selection circuits in Embodiment 2.
Figure 14F:
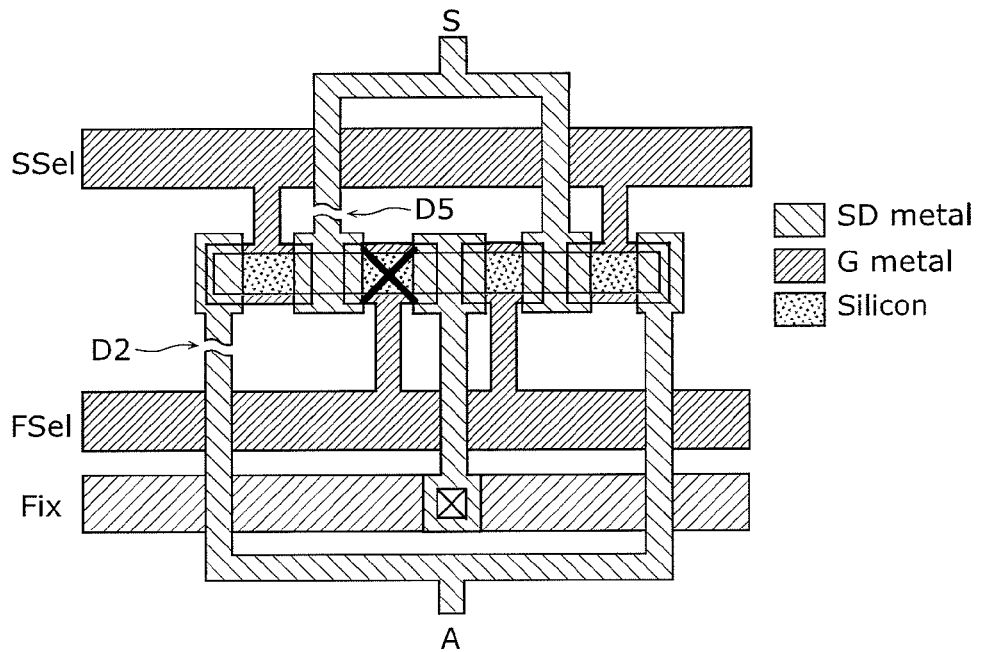
FIG. 14F is a layout diagram showing an example of repair processing for the selection circuits in Embodiment 2.
Figure 14G:
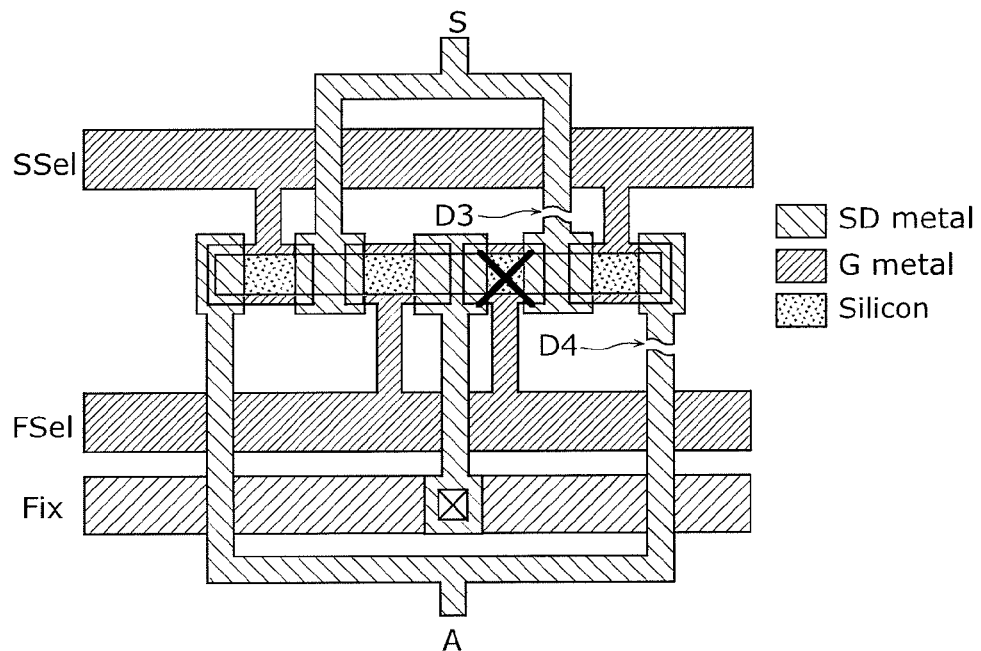
FIG. 14G is a layout diagram showing an example of repair processing for the selection circuits in Embodiment 2.
Figure 14H:
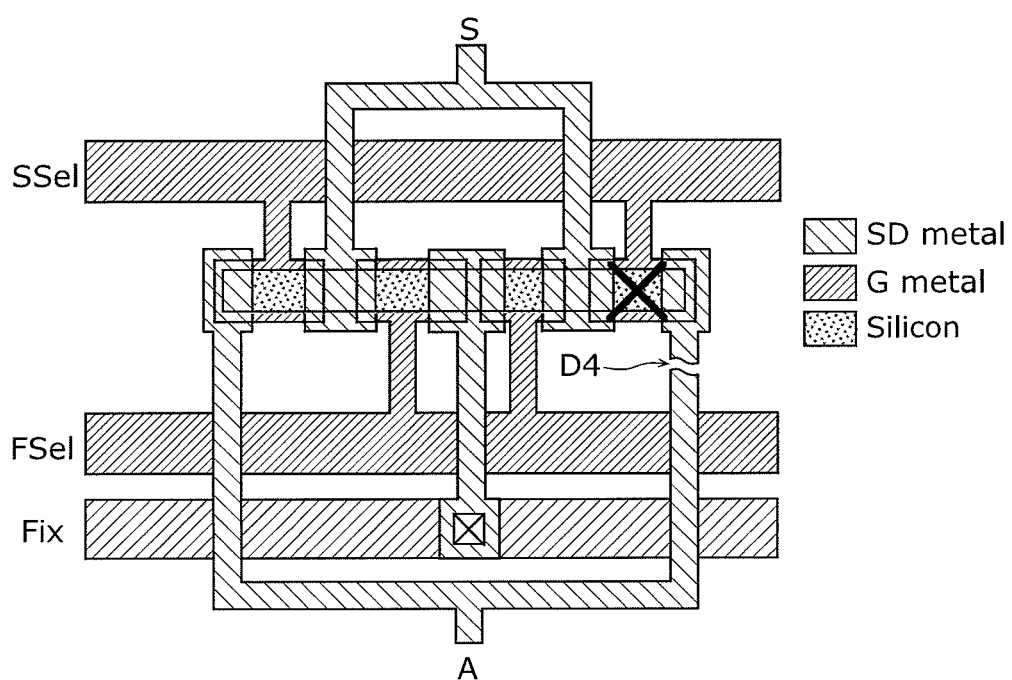
FIG. 14H is a layout diagram showing an example of repair processing for the selection circuits in Embodiment 2.
Figure 15:
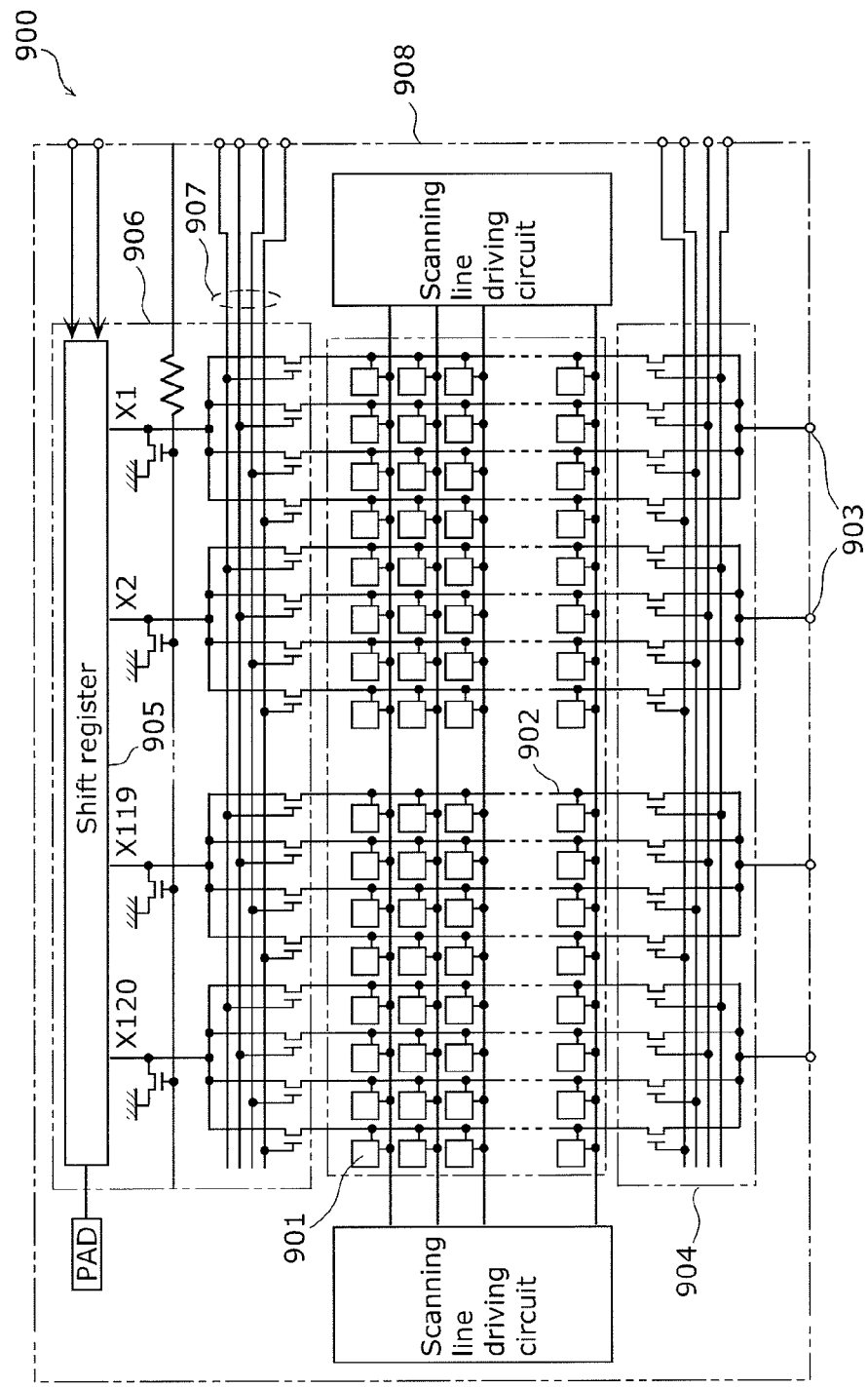
FIG. 15 is a block diagram showing the electrical configuration of a liquid crystal device.

FIG. 14A to FIG. 14D each show the repair disconnecting section to be disconnected when any of Tr1 to Tr4 has a gate leak. In particular, as shown in FIGS. 14B and 14C, when either Tr2 or Tr3 has a gate leak, there is no need to disconnect the gate line because the leak current that flows in from Tr2 and Tr3 is absorbed by the fixed potential Fix.

FIG. 14E to FIG. 14H each show the repair disconnecting section to be disconnected when any of Tr1 to Tr4 has an SD short-circuit.

According to such a layout, when any of the Tr1 to Tr4 is defective, disconnecting the appropriate one/ones of the repair disconnecting sections D1 to D6 allows each of Tr1, Tr2, Tr3, and Tr4 to be substituted with Tr4, Tr3, Tr2, and Tr1, respectively, thus improving substrate yield.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The active-matrix substrate according to one or more exemplary embodiments disclosed herein can be widely used in display panels such as an organic EL display panel, a liquid crystal display panel, and so on.

The invention claimed is:

1. An active-matrix substrate comprising:
   a substrate;
   a plurality of signal lines disposed on the substrate;
   a first terminal provided for each of signal line blocks obtained by grouping every m-lines of the signal lines into a block, m being an integer greater than or equal to 2;
   a first selection circuit provided for each of the signal line blocks, for causing conduction between the first terminal and at least one signal line selected from among the m signal lines;
   a second terminal provided for every n-blocks of the signal line blocks, n being an integer greater than or equal to 2; and
   a second selection circuit provided for every n-blocks of the signal line blocks, for causing conduction between the second terminal and at least one signal line selected from among m×n signal lines.

2. The active-matrix substrate according to claim 1, wherein the first terminal, the first selection circuit, the second terminal, and the second selection circuit make up a circuit for testing each of the signal lines.

3. The active-matrix substrate according to claim 2, wherein, when the first selection circuit causes conduction between the first terminal and the signal line to be tested, the second selection circuit is controlled so that conduction is caused between the second terminal and the signal lines other than the signal line to be tested, and a fixed potential is inputted from the second terminal.

4. The active-matrix substrate according to claim 1, wherein at least one of the first selection circuit and the second selection circuit operates as a multiplexer or a demultiplexer.

5. The active-matrix substrate according to claim 1, wherein the first selection circuit includes a plurality of first switches each of which switches between conduction and non-conduction between the first terminal and a corresponding one of the signal lines,
   the second selection circuit includes a plurality of second switches each of which switches between conduction and non-conduction between the second terminal and a corresponding one of the signal lines, and
   each of the second switches is capable of functioning as a redundancy circuit of the first switch connected to a same signal line.

6. The active-matrix substrate according to claim 1, wherein the plurality of signal lines is one of (i) a plurality of data signal lines and (ii) a plurality of scanning signal lines arranged in a direction that crosses the data signal lines.

7. The active-matrix substrate according to claim 6, wherein the second terminal and the second selection circuit are provided singly so as to be shared by all of the signal line blocks, and the second selection circuit causes conduction between the second terminal and at least one data signal line selected from among all of the data signal lines provided on the active-matrix substrate.

8. The active-matrix substrate according to claim 6, wherein the second terminal and the second selection circuit are provided singly so as to be shared by all of the scanning signal line blocks, and the second selection circuit causes conduction between the second terminal and at least one scanning signal line selected from among all of the scanning signal lines provided on the active-matrix substrate.

9. A display panel comprising:
   the active-matrix substrate according to claim 6; and
   a light-emitting element provided in each of crossings between the scanning signal lines and the data signal lines on the active-matrix substrate.

10. The display panel according to claim 9, wherein the light-emitting element is an organic electroluminescence (EL) element.

11. A method of manufacturing the display panel according to claim 9, the method comprising
   removing, from the active-matrix substrate, a portion including at least one of the first terminal, the first selection circuit, the second terminal, and the second selection circuit.

12. The active-matrix substrate according to claim 1, wherein, for each n-blocks of the signal lines, the second selection circuit is a redundancy circuit of first selection circuits of the n-blocks.

13. The active-matrix substrate according to claim 1, wherein the first selection circuit is configured to distribute a signal applied to the first terminal to the at least one signal line selected from among the m signal lines, and
   the second selection circuit is configured to distribute the signal applied to the second terminal to the at least one signal line selected from among the m signal lines to allow substitution of the first selection circuit by the second selection circuit.

14. The active-matrix substrate according to claim 1, wherein the second selection circuit is provided between the first selection circuit and the m signal lines of the block for causing conduction between the first terminal and the at least one signal line selected from among the m signal lines.

15. The active-matrix substrate according to claim 1, further comprising:
   wherein the second selection circuit receives m selection signals, with each of the m selection signals corresponding to one signal line of each block of the n-blocks.

* * * * *